US012755886B2

(12) United States Patent
Kurogi

(10) Patent No.: US 12,755,886 B2
(45) Date of Patent: Oct. 6, 2026

(54) INDUCTANCE ELEMENT AND INDUCTANCE ELEMENT FABRICATION METHOD

(71) Applicant: LAPIS SEMICONDUCTOR CO., LTD., Kanagawa (JP)

(72) Inventor: Kohei Kurogi, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 543 days.

(21) Appl. No.: 18/371,542

(22) Filed: Sep. 22, 2023

(65) Prior Publication Data

US 2024/0112845 A1 Apr. 4, 2024

(30) Foreign Application Priority Data

Sep. 30, 2022 (JP) ................................ 2022-159112

(51) Int. Cl.
*H01F 27/02* (2006.01)
*H01F 41/00* (2006.01)
(Continued)

(52) U.S. Cl.
CPC ......... *H01F 27/022* (2013.01); *H01F 41/005* (2013.01); *H01F 41/34* (2013.01); *H10D 1/20* (2025.01)

(58) Field of Classification Search
CPC ........ H01F 27/00; H01F 27/02; H01F 27/022; H01F 27/027; H01F 27/04; H01F 27/06;
(Continued)

(56) References Cited

U.S. PATENT DOCUMENTS 12,002,614 B2 * 6/2024 Stahr .................. H01F 17/0013
12,198,843 B2 * 1/2025 Furukawa ................ H01F 1/37
12,424,363 B2 * 9/2025 Yang ...................... H01F 10/30

FOREIGN PATENT DOCUMENTS

JP 2002057292 A 2/2002
JP 2002100513 A 4/2002
(Continued)

OTHER PUBLICATIONS

Japanese Office Action cited in corresponding Japanese Application No. 2022-159112, dated Jun. 9, 2026, 6 pages.

*Primary Examiner* — Hai L Nguyen
(74) *Attorney, Agent, or Firm* — VOLENTINE, WHITT & FRANCOS, PLLC

(57) ABSTRACT

An inductance element including: a support body including a main face including a first area and a second area surrounding the first area; a first resin body disposed within the first area; and an inductor provided at the main face of the support body, wherein the first resin body includes a first soft magnetic body layer and a second soft magnetic body layer that are both disposed inside the first area, wherein the inductor is positioned between the first soft magnetic body layer and the second soft magnetic body layer, wherein the first soft magnetic body layer includes a first insulating resin body and plural first magnetic bodies surrounded by the first insulating resin body, and wherein the second soft magnetic body layer includes a second insulating resin body and plural second magnetic bodies surrounded by the second insulating resin body.

8 Claims, 13 Drawing Sheets

(51) Int. Cl.
*H01F 41/34* (2006.01)
*H10D 1/20* (2025.01)

(58) Field of Classification Search
CPC .... H01F 27/32; H01F 2027/065; H01F 41/02; H01F 41/0233; H01F 41/0246; H01F 41/34
USPC ..... 336/90, 92, 65, 218, 219, 177, 223, 232, 336/77, 84 M
See application file for complete search history.

(56) References Cited

FOREIGN PATENT DOCUMENTS

| | | | |
|---|---|---|---|
| JP | 2002217033 | A | 8/2002 |
| JP | 2008210828 | A | 9/2008 |
| JP | 2010268304 | A | 11/2010 |

* cited by examiner

INDUCTANCE ELEMENT AND INDUCTANCE ELEMENT FABRICATION METHOD

CROSS-REFERENCE TO RELATED APPLICATION

This application claims priority under 35 USC 119 from Japanese Patent Application No. 2022-159112, filed on Sep. 30, 2022, the disclosure of which is incorporated by reference herein.

BACKGROUND

Technical Field

The present disclosure relates to an inductance element and to an inductance element fabrication method.

Related Art

Japanese Patent Application Laid-Open (JP-A) No. 2010-268304, discloses a wafer level package (WLP). More specifically, a resin multi-layer device is disclosed in JP-A No. 2010-268304, with the resin multi-layer device including a capacitor and an inductor and/or a balun. The resin multi-layer device is, for example, employed in a high frequency circuit of a wireless communication device.

A fabrication process for forming multiple layers or a thick-film resin layer above a support body configured by a semiconductor substrate is a possible cause of wafer warping, and in a semiconductor chip, thinning the semiconductor chip is also a possible cause of wafer warping.

SUMMARY

The present disclosure is to provide an inductance element having a structure that may reduce warping, and an inductance element fabrication method that may reduce warping.

A first aspect of the present disclosure is an inductance element including: a support body including a main face including a first area and a second area surrounding the first area; a first resin body disposed within the first area; and an inductor provided at the main face of the support body, wherein the first resin body includes a first soft magnetic body layer and a second soft magnetic body layer that are both disposed inside the first area, wherein the inductor is positioned between the first soft magnetic body layer and the second soft magnetic body layer, wherein the first soft magnetic body layer includes a first insulating resin body and plural first magnetic bodies surrounded by the first insulating resin body, and wherein the second soft magnetic body layer includes a second insulating resin body and plural second magnetic bodies surrounded by the second insulating resin body.

A second aspect of the present disclosure is a method for fabricating an inductance element, the method including: preparing a substrate including a main face with a first area and a second area surrounding the first area; forming a first soft magnetic body layer above the first area of the substrate; forming, after the first soft magnetic body layer has been formed, a conducting layer that includes a first portion positioned above the first area and a second portion positioned above the second area and that spans to the first area of the substrate and the second area of the substrate; forming an outer end electrode above the second portion of the conducting layer; and forming, after the conducting layer has been formed, a second soft magnetic body layer in the first area of the substrate, wherein the first soft magnetic body layer includes a first insulating resin body and plural first magnetic bodies surrounded by the first insulating resin body, and wherein the second soft magnetic body layer includes a second insulating resin body and plural second magnetic bodies surrounded by the second insulating resin body.

According to the above aspects, the inductance element and the inductance element fabrication method of the present disclosure may reduce warping.

BRIEF DESCRIPTION OF THE DRAWINGS

Exemplary embodiments will be described in detail based on the following figures, wherein.

DETAILED DESCRIPTION

Figure 1A:
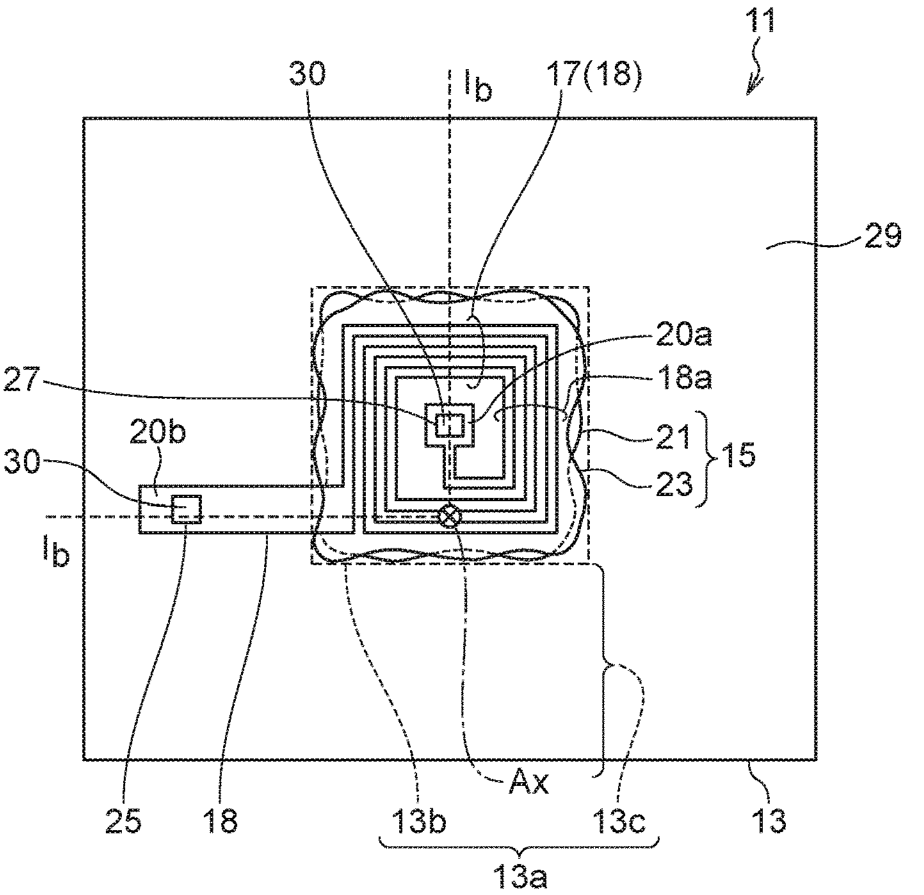
FIG. 1A is a diagram schematically illustrating an inductance element according to an exemplary embodiment.

Description follows regarding respective exemplary embodiments for implementing the present disclosure, with reference to the drawings. The same or similar reference numerals will be appended to the same or similar portions and duplicate explanation thereof will be omitted.

Figure 1B:
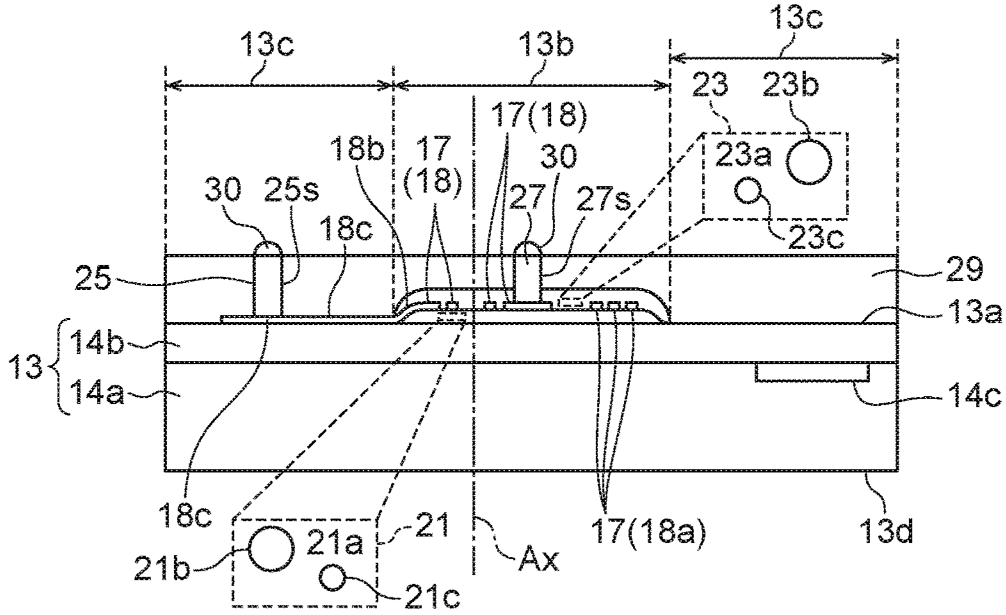
FIG. 1B is a diagram schematically illustrating an inductance element according to the present exemplary embodiment in a cross-section taken along line Ib-Ib of FIG. 1A.

FIG. 1A is a diagram schematically illustrating an inductance element according to an exemplary embodiment. FIG. 1B is a cross-section taken along line Ib-Ib of FIG. 1A, and is a diagram schematically illustrating an inductance element according to the present exemplary embodiment.

An inductance element 11 includes a support body 13, a first resin body 15, and an inductor 17.

The support body 13 includes a main face 13*a* and a back face 13*d*. The back face 13*d* is positioned at opposite side of the main face 13*a*. The main face 13*a* includes a first area 13*b* and a second area 13*c*, the second area 13*c* surrounding the first area 13*b*. The first resin body 15 is positioned inside the first area 13*b* of the main face 13*a*. The inductor 17 is configured from a conductor, and is positioned above the main face 13*a* of the support body 13. The first resin body 15 may include at least a first soft magnetic body layer 21 and a second soft magnetic body layer 23. The first soft magnetic body layer 21 and the second soft magnetic body layer 23 are disposed so as to at least partly overlap inside the first area 13*b* of the main face 13*a*.

The inductor 17 is provided between the first soft magnetic body layer 21 and the second soft magnetic body layer 23. The first soft magnetic body layer 21 includes a first insulating resin body 21*a*, and plural first magnetic bodies 21*b*, 21*c*, surrounded by the first insulating resin body 21*a*. The first magnetic bodies 21*b*, 21*c*, are distributively placed by the first insulating resin body 21*a*. The second soft magnetic body layer 23 includes a second insulating resin body 23*a*, and plural second magnetic bodies 23*b*, 23*c* surrounded by the second insulating resin body 23*a*. The second magnetic bodies 23*b*, 23*c*, are distributively placed by the second insulating resin body 23*a*.

In the inductance element 11, the first soft magnetic body layer 21 and the second soft magnetic body layer 23 sandwich the inductor 17 from both sides of the inductor 17, and provide an greater magnetic permeability than air, at a periphery of the inductor 17. The insulating resin bodies (21*a*, 23*a*) of the first soft magnetic body layer 21 and the second soft magnetic body layer 23 respectively enable magnetic bodies (for example, magnetic fragments, magnetic particles, magnetic powder, or magnetic filler) to be distributively placed in the resin body, enabling non-uniformity in the magnetic permeability to be reduced in the first soft magnetic body layer 21 and the second soft magnetic body layer 23, respectively. The first soft magnetic body layer 21 and the second soft magnetic body layer 23 respectively form an insulating region (21*a*, 23*b*) surrounding the inductor 17. Furthermore, densities of the magnetic bodies (21*b*, 23*b*) in the first soft magnetic body layer 21 and the second soft magnetic body layer 23 may be set to values at a level such that shorting of the inductor 17 due to linking up of the magnetic bodies in the respective soft magnetic body layers does not occur. An upper limit size of the magnetic bodies (21*b*, 23*b*) may be set to a value at a level such that shorting of the inductor 17 does not occur through the magnetic bodies in the soft magnetic body layers and, for example, may be set to 100 microns or less. Limitation to the upper limit size of the magnetic bodies (21*b*, 23*b*) is able to be relaxed by increasing the thickness of the first soft magnetic body layer 21 and the second soft magnetic body layer 23.

The insulating resin bodies (21*a*, 23*a*) may, for example, be configured from a resin capable of being supplied onto the substrate by a dispenser and then hardened, and such resins contain a thermosetting agent. An ultraviolet curing agent may also be included therein as necessary, either instead of the thermosetting agent or in addition to the thermosetting agent.

The first magnetic bodies 21*b*, 21*c* and the second magnetic bodies 23*b*, 23*c* may contain magnetic material. More specifically, the first magnetic bodies 21*b*, 21*c* and the second magnetic bodies 23*b*, 23*c* may contain a magnetic metal element, or may contain a magnetic oxide such as ferrite.

The support body 13, for example, may contain a semiconductor region 14*a*, and may contain an insulator region 14*b* positioned above the semiconductor region 14*a* and configured from an inorganic or organic material having insulating properties. The semiconductor region 14*a* may, for example, be configured by silicon, silicon carbide, germanium, or silicon-germanium. In the present exemplary embodiment, the main face 13*a* of the support body 13 may be provided by the insulator region 14*b*. The semiconductor region 14*a* may, for example, include one or plural semiconductor devices 14*c*.

The inductor 17 includes a conducting layer 18 extending along the main face 13*a*, with the conducting layer 18 including a pattern configured so as to generate inductance. The conducting layer 18 may, for example, contain copper. In the inductance element 11, inductance is generated by the pattern of the conducting layer 18 and, for example, a two-dimensional inductor 17 is provided thereby. The inductance of the inductor 17 is provided by an inductor main portion 18*a* of the conducting layer 18. As illustrated in FIG. 1A, the inductor main portion 18*a* has, for example, a two-dimensional spiral shape. The conducting layer 18 includes a first portion 18*b* positioned above the first area 13*b*, and a second portion 18*c* positioned above the second area 13*c*.

The inductance element 11 may also further include an outer end electrode 25, with the outer end electrode 25 positioned inside the second area 13*c* (above the second portion 18*c*) in the present exemplary embodiment. The outer end electrode 25 is separated from the first resin body 15. The outer end electrode 25 is positioned above the second portion 18*c* of the conducting layer 18, and processing is not performed on the first soft magnetic body layer 21 nor on the second soft magnetic body layer 23 to form the outer end electrode 25.

The inductance element 11 may further include an inner end electrode 27, with the inner end electrode 27 positioned above the first portion 18*b* of the conducting layer 18 in the present exemplary embodiment. The first portion 18*b* of the conducting layer 18 is positioned above the first soft magnetic body layer 21, and is positioned under the second soft magnetic body layer 23.

Figure 2:
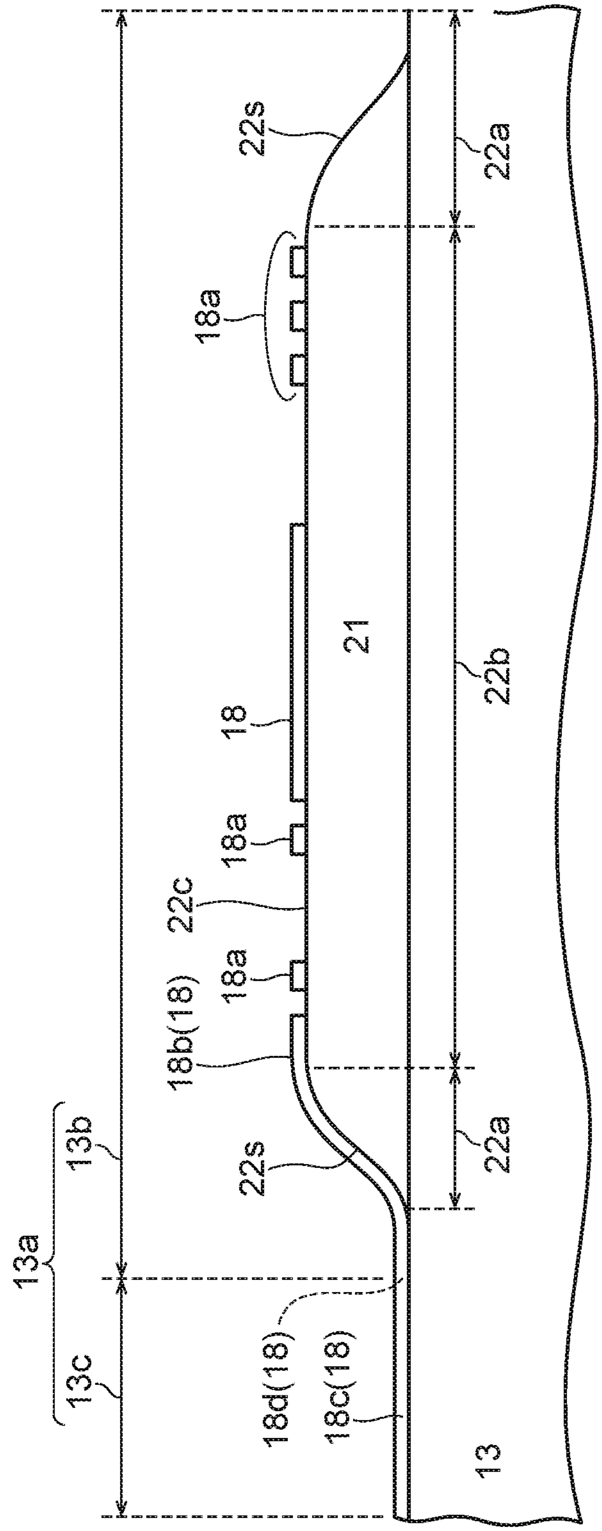
FIG. 2 is a diagram illustrating a conducting layer and a first soft magnetic body layer of an inductance element according to the present exemplary embodiment in a cross-section taken along line Ib-Ib of FIG. 1A.

FIG. 2 is a diagram illustrating the conducting layer 18 and the first soft magnetic body layer 21 of the inductance element 11 according to the present exemplary embodiment in a cross-section taken along line Ib-Ib.

For ease of understanding, in FIG. 2 the conducting layer 18 and the first soft magnetic body layer 21 are depicted provided above the support body 13. The first soft magnetic body layer 21 includes a bottom edge portion 22*a* disposed above the first area 13*b* of the main face 13*a* and a central portion 22*b* surrounded by the bottom edge portion 22*a*. The bottom edge portion 22*a* is inclined with respect to an upper face 22*c* of the central portion 22*b*, enabling a thickness of the first soft magnetic body layer 21 to thin gradually in the bottom edge portion 22*a*. A side face 22*s* of the bottom edge portion 22*a* is inclined gently with respect to the upper face 22*c* of the central portion 22*b*, and in order to dispose the first soft magnetic body layer 21 inside the first area 13*b*, a change in thickness of the first soft magnetic body layer 21 occurs at the bottom edge portion 22*a*. The upper face 22*c* of the central portion 22*b* is substantially flat compared to the side face 22*s* of the bottom edge portion 22*a*. In the cross-section illustrated in FIG. 2, the size of the upper face 22*c* of the central portion 22*b* may be at least 5 times the size of the bottom edge portion 22*a* extending from the central portion 22*b* along the main face 13*a*, or may be at least 10 times thereof. Configuring with such a size ratio provides an appropriate size for the placement of the conducting layer 18 of the inductance element 11 in the central portion 22*b*.

With reference to FIG. 1A, FIG. 1B, and FIG. 2, in the present exemplary embodiment the inductor main portion 18*a* of the conducting layer 18 is able to be disposed within the upper face 22*c* of the central portion 22*b*. The side face 22*s* of the bottom edge portion 22*a* does not include a sudden step of an amount exceeding the thickness of the conducting layer 18, for example a perpendicular cliff shape. The first magnetic bodies 21*b*, 21*c* in the first soft magnetic body layer 21 are able to be covered by the first insulating resin body 21*a* without substantially appearing at an upper side face of the first soft magnetic body layer 21.

The conducting layer 18 further includes a third portion 18*d* at a position above the first area 13*b* and the second area 13*c*. The third portion 18*d* crosses a boundary between the first area 13*b* and the second area 13*c*, and links the first portion 18*b* and the second portion 18*c* together. The outer end electrode 25 and the inner end electrode 27 are respectively connected to an outer end 20*b* and an inner end 20*a*.

The inductance element 11 enables a large inductance to be provided by combining the spiral shaped conducting layer 18, together with the first soft magnetic body layer 21 and the second soft magnetic body layer 23 sandwiching the inductor main portion 18*a* of the conducting layer 18.

More specifically, the conducting layer 18 includes the first portion 18*b* positioned inside the first area 13*b* (see FIG. 2), and the second portion 18*c* positioned inside the second area 13*c* (see FIG. 2). Moreover, a pattern of the conducting layer 18 includes the inner end 20*a* positioned above the first area 13*b* (see FIG. 1) and the outer end 20*b* positioned above the second area 13*c* (see FIG. 1).

In the present exemplary embodiment, the inductor main portion 18*a* has a spiral shape, and the conducting layer 18 extends from the spiral shaped inner end 20*a* either clockwise or counter-clockwise so as to surround the inner end 20*a*. The inductor main portion 18*a* includes plural orbiting portions that orbit to surround the inner end 20*a*. The plural orbiting portions of the conducting layer 18 include an inside portion at the innermost side of the spiral shape, and an outside portion at the outermost side of the spiral shape. At least one out of the first soft magnetic body layer 21 and the second soft magnetic body layer 23 is positioned between the orbiting portions, and contributes to closing the lines of magnetic flux. The conducting layer 18 includes one or plural intermediate orbiting portions between the inside portion and the outside portion.

Figure 3:
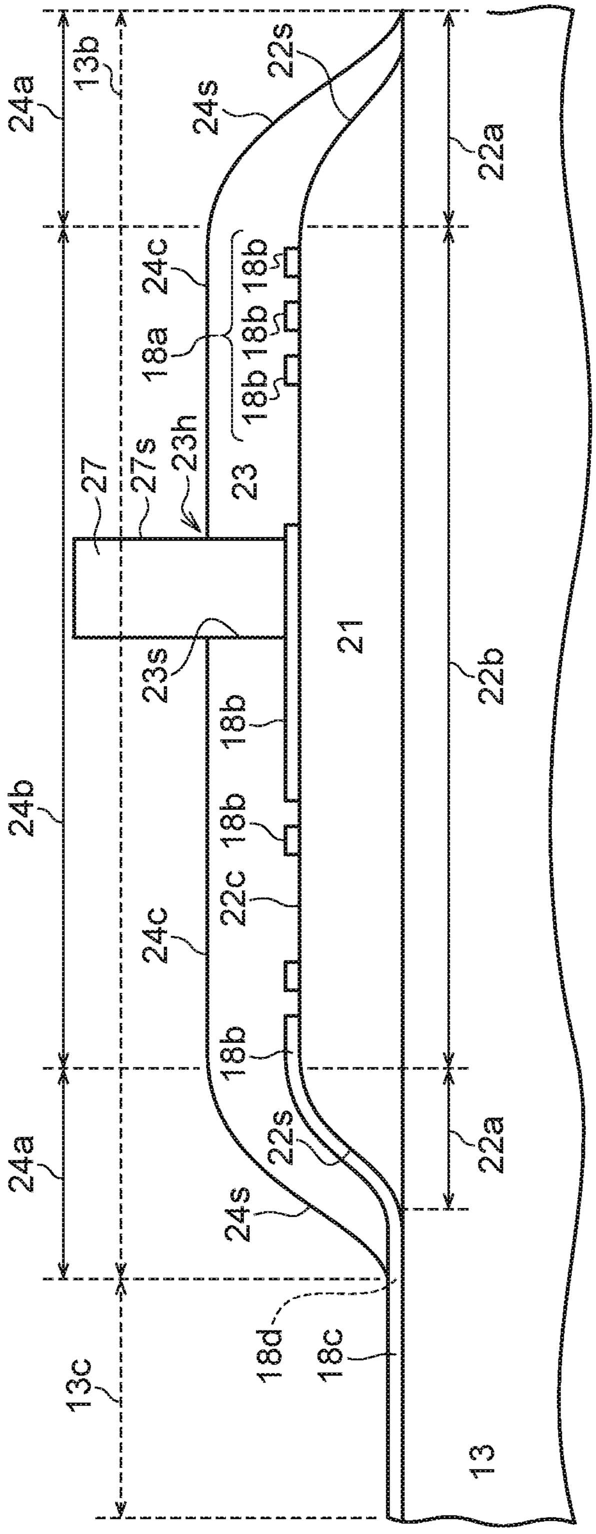
FIG. 3 is a diagram illustrating a conducting layer and a soft magnetic body layer of an inductance element according to the present exemplary embodiment in a cross-section taken along line Ib-Ib of FIG. 1A.

FIG. 3 is a diagram illustrating the conducting layer 18 and the soft magnetic body layers 21, 23 of the inductance element 11 according to the present exemplary embodiment in a cross-section taken along line Ib-Ib. In order to facilitate understanding, FIG. 2 depicts the conducting layer 18, the first soft magnetic body layer 21, the second soft magnetic body layer 23, and the inner end electrode 27 provided above the support body 13. The second soft magnetic body layer 23 includes a bottom edge portion 24*a* disposed above the first area 13*b* of the main face 13*a*, and a central portion 24*b* surrounded by the bottom edge portion 24*a*. The bottom edge portion 24*a* is inclined with respect to an upper face 24*c* of the central portion 24*b*, enabling a thickness of the second soft magnetic body layer 23 to thin gradually in the bottom edge portion 24*a*. A side face 24*s* of the bottom edge portion 24*a* is inclined gently with respect to the upper face 24*c* of the central portion 24*b*, and in order to dispose the second soft magnetic body layer 23 inside the first area 13*b*, a change in thickness of the second soft magnetic body layer 23 occurs at the bottom edge portion 24*a*. The upper face 24*c* of the central portion 24*b* is substantially flat compared to the side face 24*s* of the bottom edge portion 24*a*. In the cross-section illustrated in FIG. 3, the size of the upper face 24*c* of the central portion 24*b* may be at least 5 times the size of the bottom edge portion 24*a* extending from the central portion 24*b* along the surface of the first soft magnetic body layer 21, or may be at least 10 times thereof. Configuring with such a size ratio provides an appropriate size at the central portion 24*b* to cover the conducting layer 18 of the inductance element 11.

The second soft magnetic body layer 23 includes a hole 23*h*, with the hole 23*h* positioned above the first portion 18*b* of the conducting layer 18. Moreover, the hole 23*h* reaches as far as the first portion 18*b* of the conducting layer 18. The inner end electrode 27 extends inside the hole 23*h* of the second soft magnetic body layer 23 and reaches as far as the conducting layer 18, such that the second soft magnetic body layer 23 covers part of a side face 27*s* of the inner end electrode 27. More specifically, the second soft magnetic body layer 23 is formed after the inner end electrode 27 has been formed, and so the hole 23*h* of the second soft magnetic body layer 23 is shaped so as to match the shape of the inner end electrode 27. Therefore, the size of the hole 23*h* matches the cross-sectional shape of the conducting layer 18, and a lower portion of the side face 27*s* of the inner end electrode 27 adheres to the side face 23*s* of the hole 23*h*. An upper portion of the side face 27*s* of the inner end electrode 27 is not covered by the second soft magnetic body layer 23. In the inductance element 11, the inner end electrode 27 is placed in conduction with the conducting layer 18 through the hole 23*h* of the second soft magnetic body layer 23.

The outer end electrode 25 is separated from the first resin body 15, enabling the outer end electrode 25 to be formed without performing processing on the first resin body 15.

As illustrated in FIG. 1, the inductance element 11 may further include a second resin body 29, with the second resin body 29 provided above the first area 13*b* and the second area 13*c*, and more specifically may be provided to the entire surface of the support body 13. The second resin body 29 covers the first resin body 15. The second resin body 29 covers a side face 25*s* of the outer end electrode 25, and covers an upper portion of the side face 27*s* of the inner end electrode 27. The second resin body 29 may, for example, be a covering body containing a covering resin configured from an epoxy, polyimide, or the like. Upper faces of the outer end electrode 25 and the inner end electrode 27 are not covered by the second resin body 29, and are accordingly exposed.

The inductance element 11 enables the second resin body 29 to be provided above the first area 13*b* and the second area 13*c* of the main face 13*a* while avoiding providing the first resin body 15 including the soft magnetic body layers above the second area 13*c*. The second resin body 29 covers the entire first resin body 15 including the soft magnetic bodies, and is able to protect the first resin body 15.

In the present exemplary embodiment, the inductance element 11 may include connection electrodes 30 configured from solder balls (for example AuSn) positioned at respective upper ends of the outer end electrode 25 and the inner end electrode 27.

FIG. 4A to FIG. 13B are diagrams illustrating relevant processes in a method for fabricating the inductance element according to the present exemplary embodiment. Explanation follows in which, instead of the support body 13, a wafer sized substrate is employed in the fabrication of the inductance element 11, however for simplification description follows with respect to a support body 13. The reason for this is that FIG. 4A to FIG. 13B each illustrate a single element block. FIG. 4A to FIG. 13A each illustrate a plan view of a fabrication process of an element according to FIG. 1A, and FIG. 4B to FIG. 13B each illustrate a cross-section of a fabrication process of an element according to FIG. 1B.

Figure 4A:
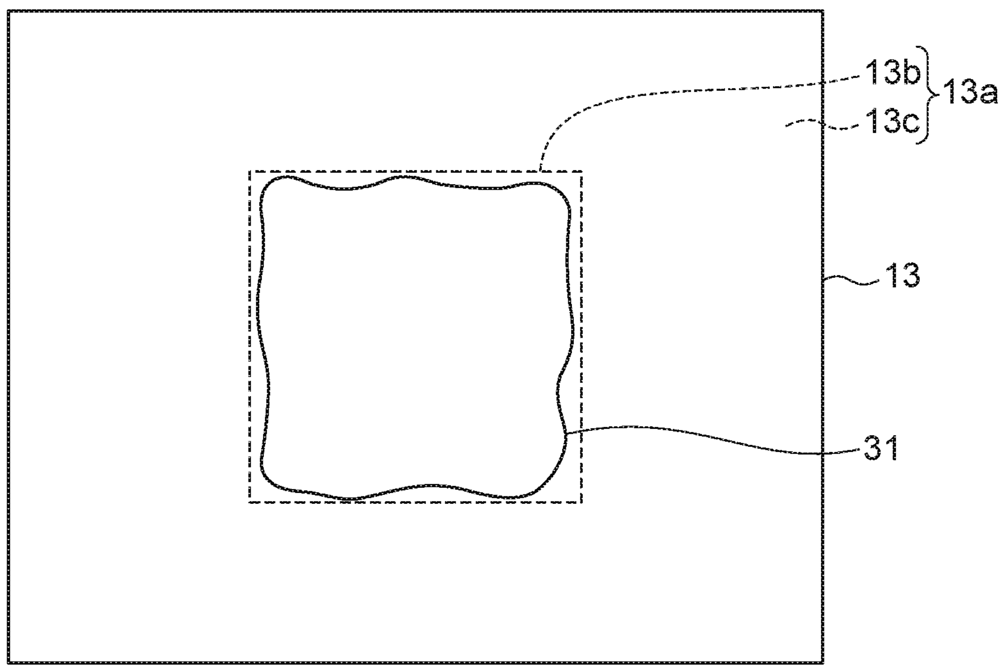
FIG. 4A is a plan view illustrating a single element block in a fabrication process of an element according to FIG. 1A.
Figure 4B:
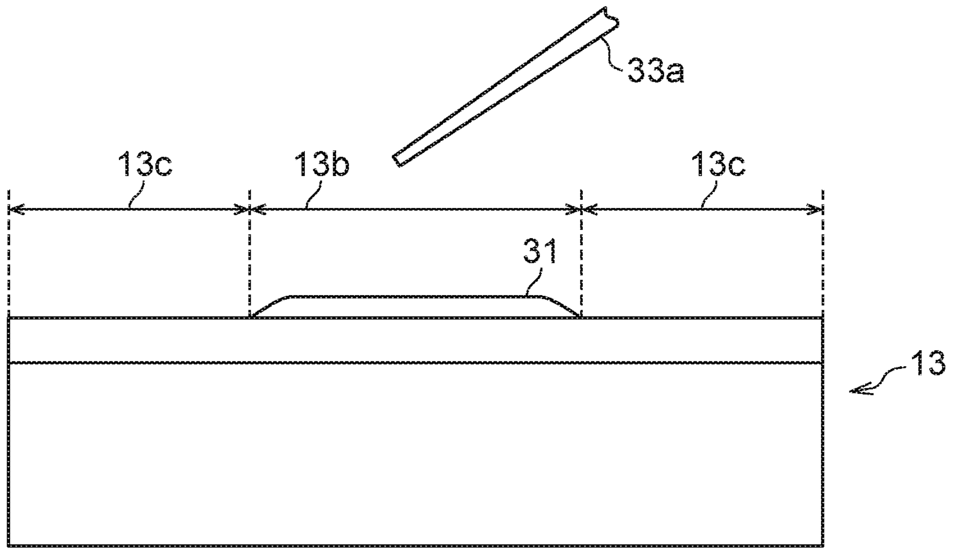
FIG. 4B is a diagram illustrating a fabrication process in a cross-section corresponding to line Ib-Ib of FIG. 1A.

The support body 13 (substrate) including the main face 13*a* is prepared (see FIG. 4A and FIG. 4B). The main face 13*a* includes the first area 13*b* and the second area 13*c*. After preparation thereof, the first soft magnetic body layer 21 is formed above the first area 13*b* of the support body 13. Forming the first soft magnetic body layer 21 is performed in the following sequence.

First, an uncured first soft magnetic body resin liquid 31 is prepared for the first soft magnetic body layer 21, and also the first soft magnetic body resin liquid 31 is disposed so as to be limited to within the first area 13*b* of the support body 13. This disposal may be performed by various methods, such as, for example, dripping, printing, or coating the first soft magnetic body resin liquid 31 inside the first area 13*b*. In the present exemplary embodiment the first soft magnetic body resin liquid 31 is disposed inside the first area 13*b* using a dispenser 33*a*.

Figure 5A:
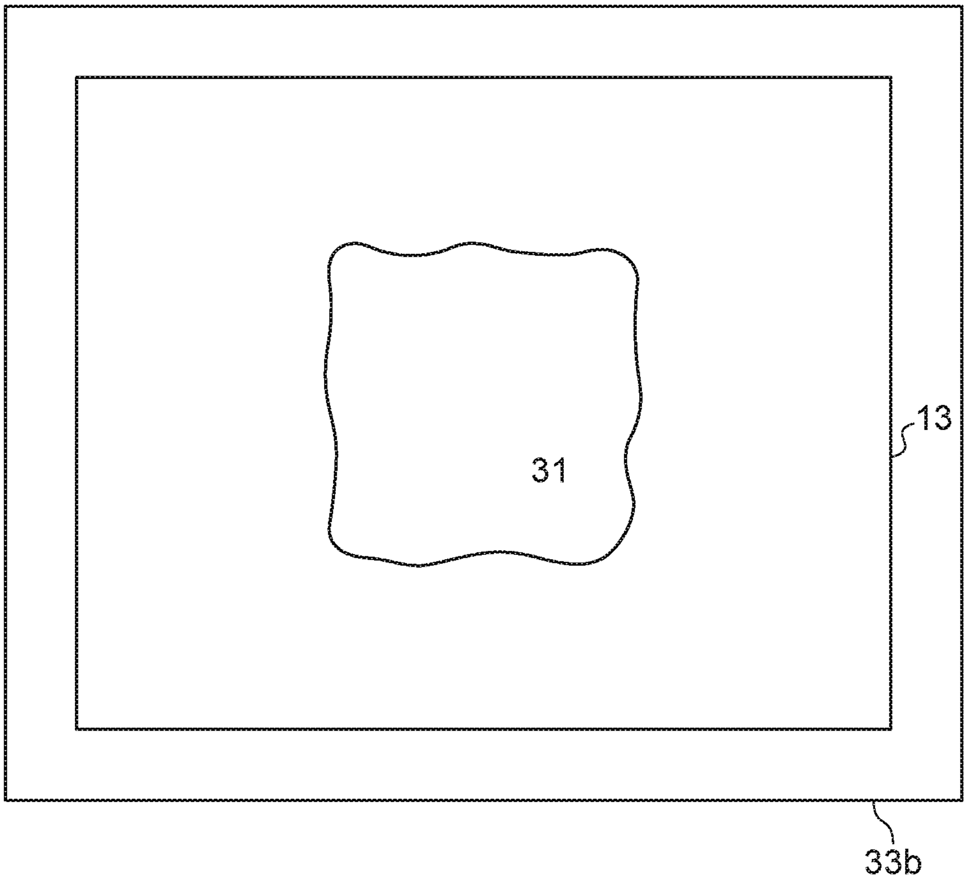
FIG. 5A is a plan view illustrating a single element block in a fabrication process of an element according to FIG. 1A.
Figure 5B:
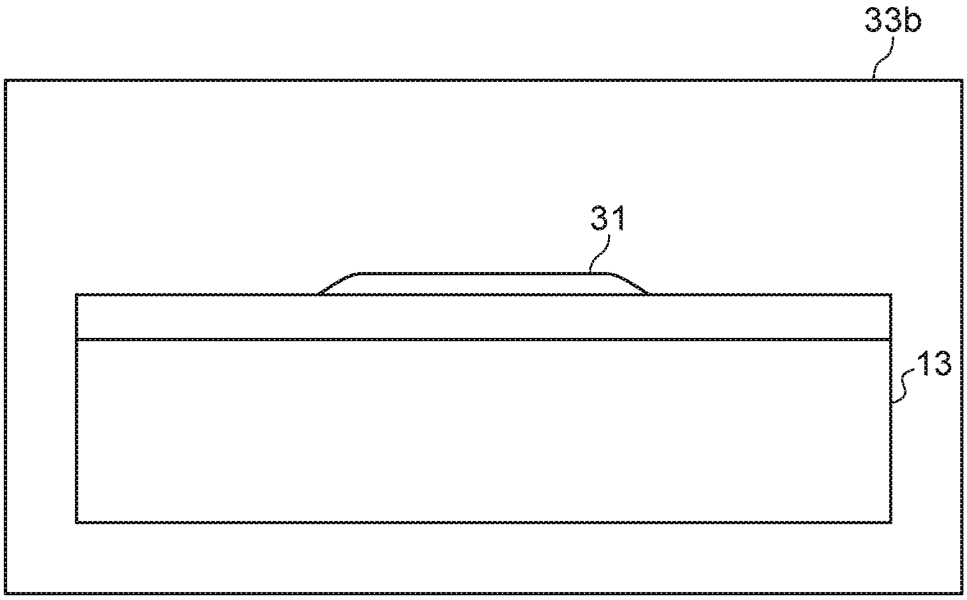
FIG. 5B is a diagram illustrating a fabrication process in a cross-section corresponding to line Ib-Ib of FIG. 1A.

After the first soft magnetic body resin liquid 31 has been disposed inside the first area 13*b*, next the first soft magnetic body resin liquid 31 is cured to obtain the first soft magnetic body layer 21, see FIG. 5A and FIG. 5B. In the present exemplary embodiment heat treatment is employed for curing. More specifically, the support body 13 including the first soft magnetic body resin liquid 31 is disposed inside a heat treatment device 33*b* (for example, a baking apparatus), and the first soft magnetic body layer 21 is generated from the first soft magnetic body resin liquid 31 by the heat treatment.

Figure 6A:
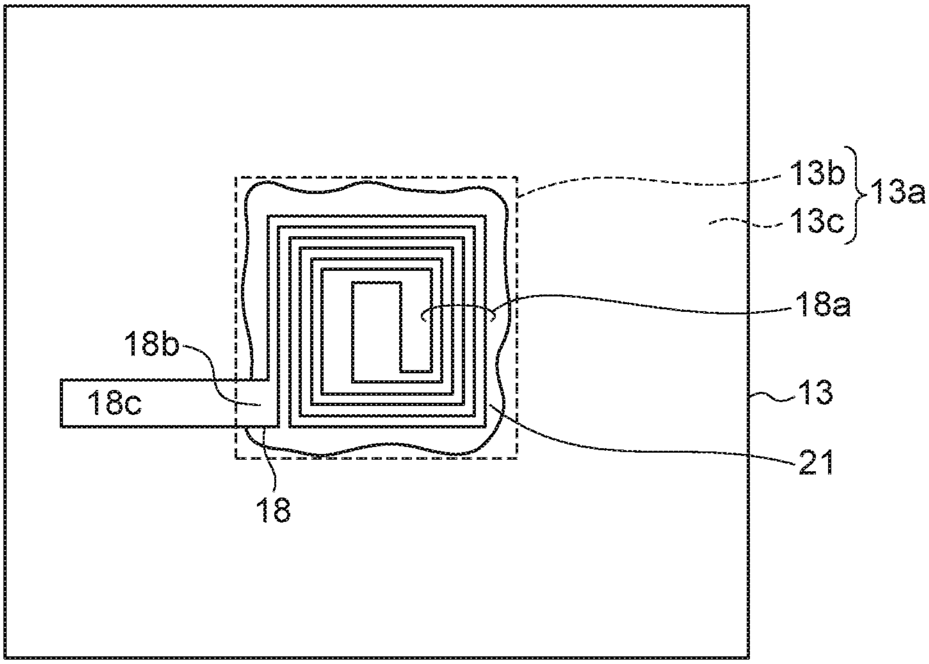
FIG. 6A is a plan view illustrating a single element block in a fabrication process of an element according to FIG. 1A.
Figure 6B:
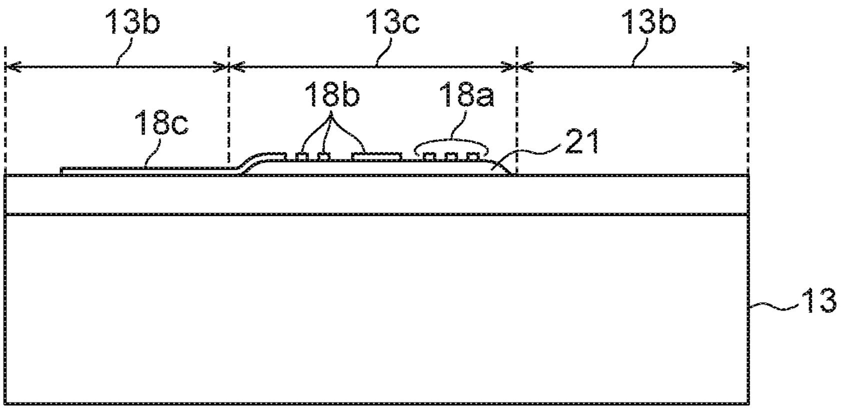
FIG. 6B is a diagram illustrating a fabrication process in a cross-section corresponding to line Ib-Ib of FIG. 1A.

After the first soft magnetic body layer 21 has been formed, the conducting layer 18 is formed with a pattern for the inductor 17, see FIG. 6A and FIG. 6B. The conducting layer 18 includes the first portion 18*b* positioned above the first area 13*b* of the support body 13, and the second portion 18*c* of the support body 13 positioned above the second area 13*c*. The conducting layer 18 extends so as to cross the boundary between first area 13*b* and the second area 13*c*. Pattern forming of the conducting layer 18 is performed by, for example, depositing or pattern forming a conducting film. Depositing a conducting film is performed by depositing a metal, for example titanium, using a sputtering method for example. Pattern forming may, for example, be performed by performing photolithography or etching, or by employing a lift off method.

Figure 7A:
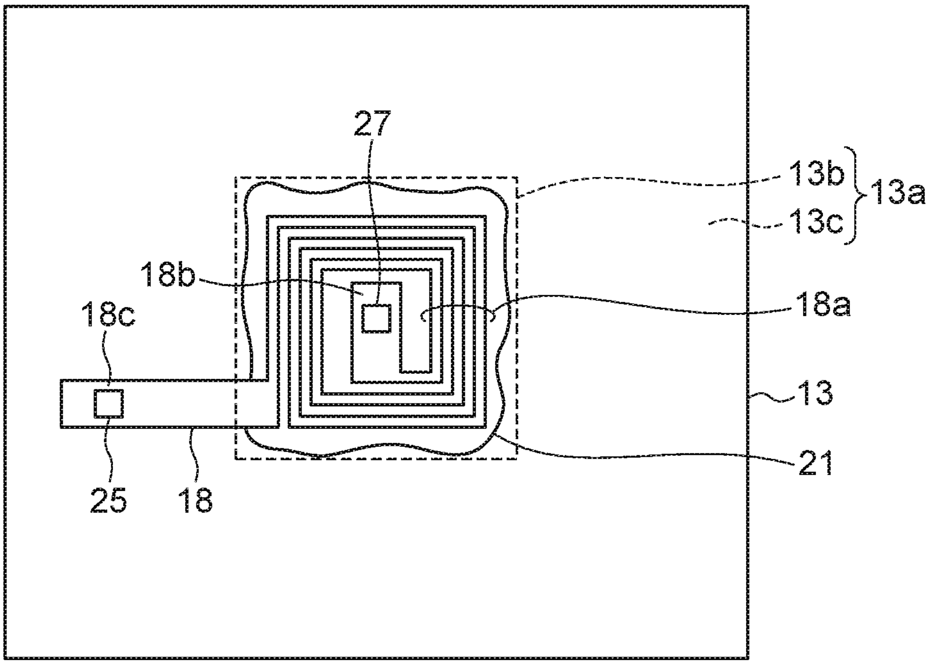
FIG. 7A is a plan view illustrating a single element block in a fabrication process of an element according to FIG. 1A.
Figure 7B:
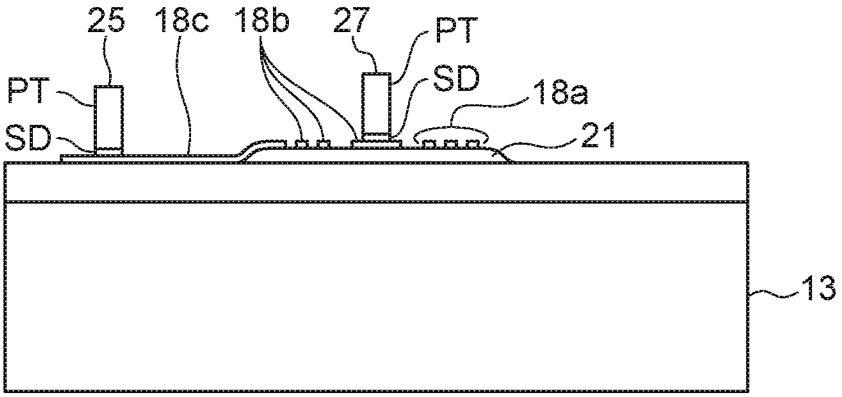
FIG. 7B is a diagram illustrating a fabrication process in a cross-section corresponding to line Ib-Ib of FIG. 1A.

In the present exemplary embodiment, the outer end electrode 25 and the inner end electrode 27 are formed above the conducting layer 18, see FIG. 7A and FIG. 7B. The outer end electrode 25 and the inner end electrode 27 may each be formed in a separate process. However, in the present exemplary embodiment, the outer end electrode 25 and the inner end electrode 27 are formed together in a single process. The outer end electrode 25 and the inner end electrode 27 are formed respectively above the first portion 18*b* and the second portion 18*c* of the conducting layer 18. Forming of the outer end electrode 25 and the inner end electrode 27 is performed, for example, using an electroplating method. More specifically, after a seed layer SD has been formed above the entire surface of the support body 13, a resist film is formed with a pattern for the outer end electrode 25 and the inner end electrode 27. The support body 13 and the resist film are immersed in an electroplating liquid, and metal deposition is induced while passing current. In the present exemplary embodiment, copper posts PT are formed using an electroplating method.

Figure 8A:
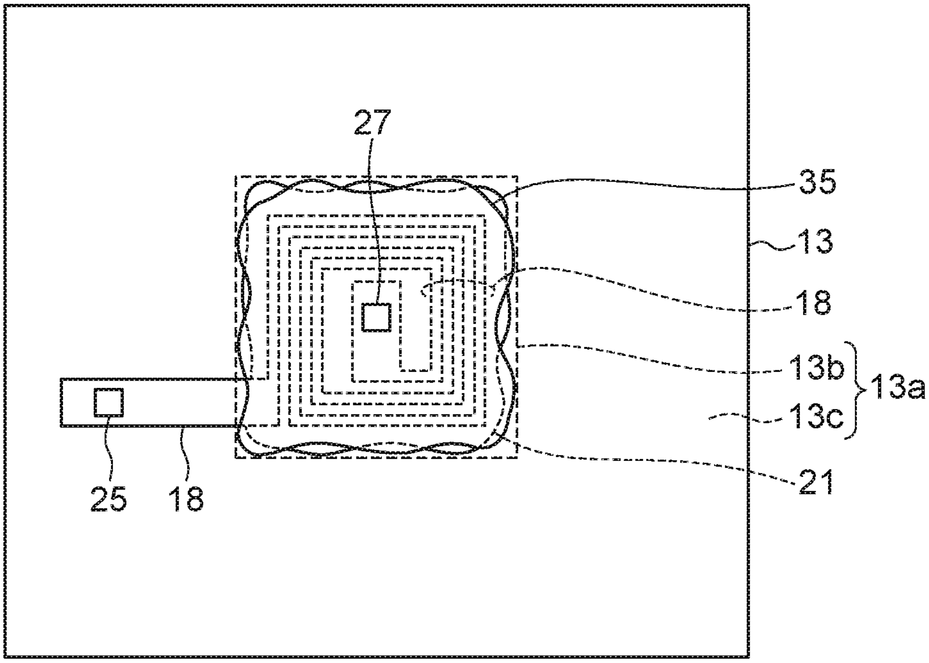
FIG. 8A is a plan view illustrating a single element block in a fabrication process of an element according to FIG. 1A.
Figure 8B:
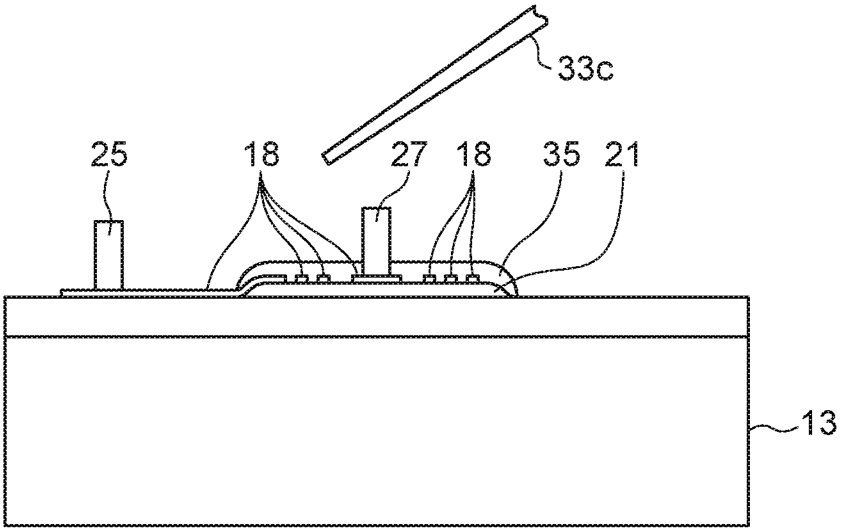
FIG. 8B is a diagram illustrating a fabrication process in a cross-section corresponding to line Ib-Ib of FIG. 1A.

After the outer end electrode 25 and the inner end electrode 27 have been formed, the second soft magnetic body layer 23 is then formed to the first area 13*b* of the support body 13, see FIG. 8A and FIG. 8B. Forming the second soft magnetic body layer 23 is performed in the following sequence.

First an uncured second soft magnetic body resin liquid 35 is prepared for the second soft magnetic body layer 23, and also the second soft magnetic body resin liquid 35 is disposed so as to be limited to inside the first area 13*b* of the support body 13. Such disposing may be performed by various methods, such as, for example, dripping, printing, or coating the second soft magnetic body resin liquid 35 inside the first area 13*b*. In the present exemplary embodiment the second soft magnetic body resin liquid 35 is disposed inside the first area 13*b* using a dispenser 33*c*.

Figure 9A:
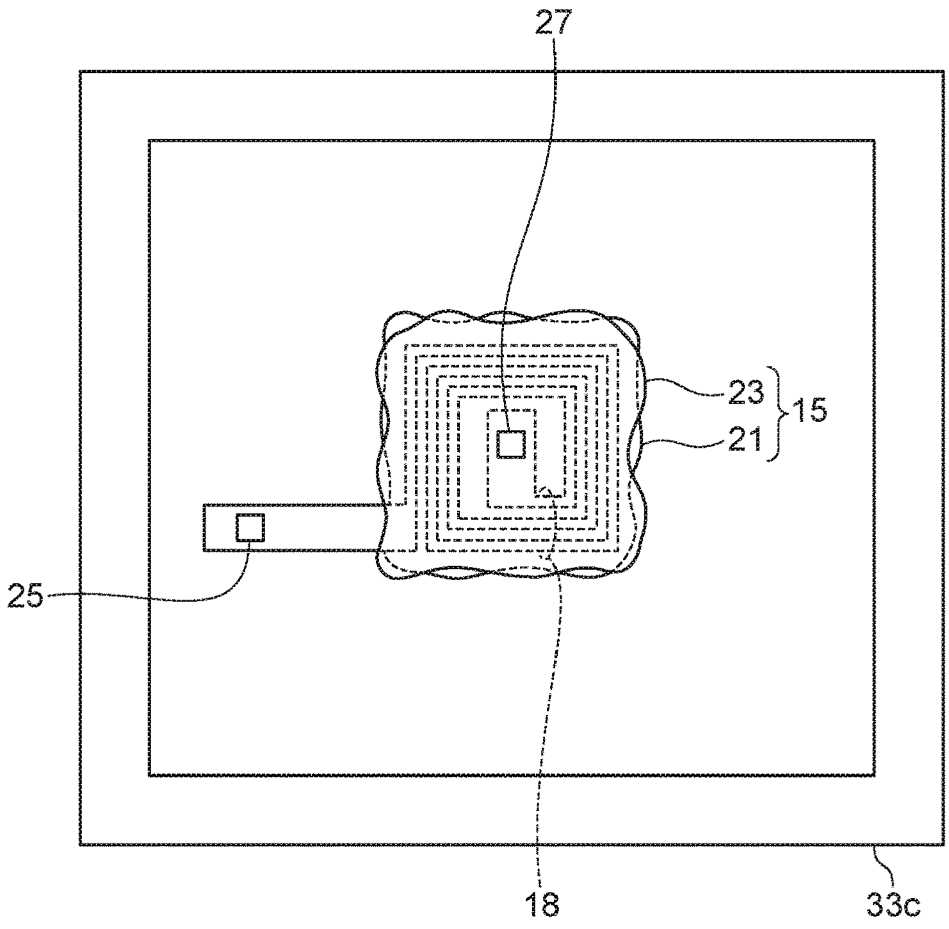
FIG. 9A is a plan view illustrating a single element block in a fabrication process of an element according to FIG. 1A.
Figure 9B:
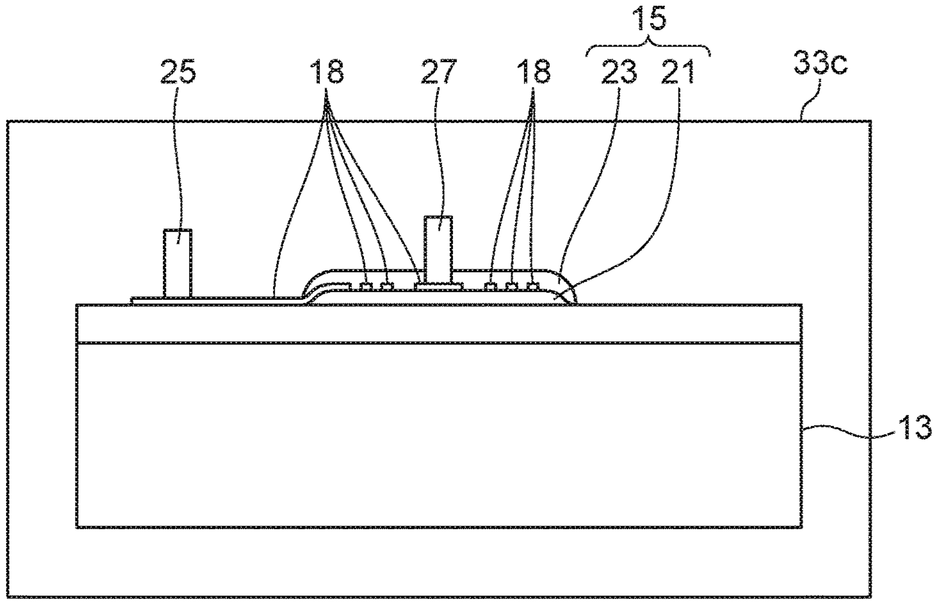
FIG. 9B is a diagram illustrating a fabrication process in a cross-section corresponding to line Ib-Ib of FIG. 1A.

After the second soft magnetic body resin liquid 35 has been disposed within the first area 13*b*, next the second soft magnetic body resin liquid 35 is cured to obtain the second soft magnetic body layer 23, see FIG. 9A and FIG. 9B. In the present exemplary embodiment heat treatment is employed for curing. More specifically, the support body 13 including the second soft magnetic body resin liquid 35 is disposed inside a heat treatment device 33*d* (for example, a baking apparatus), and the second soft magnetic body layer 23 is generated from the second soft magnetic body resin liquid 35 by the heat treatment.

Figure 10A:
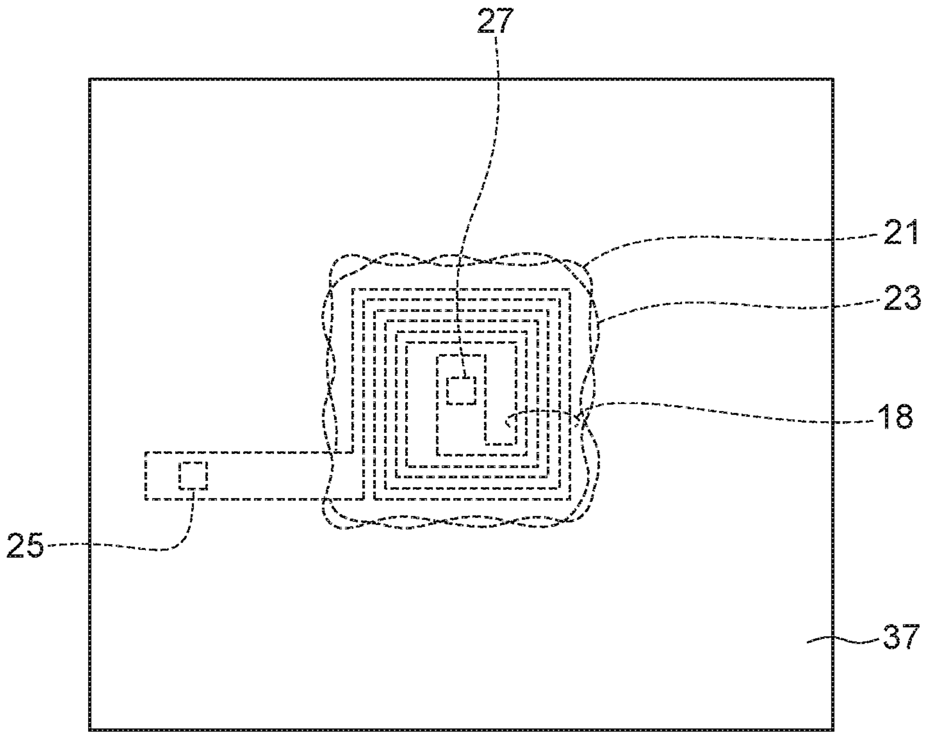
FIG. 10A is a plan view illustrating a single element block in a fabrication process of an element according to FIG. 1A.
Figure 10B:
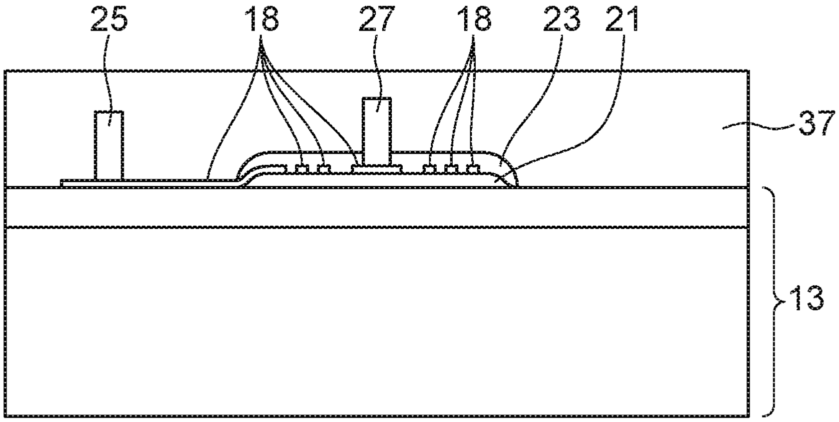
FIG. 10B is a diagram illustrating a fabrication process in a cross-section corresponding to line Ib-Ib of FIG. 1A.

After the first resin body 15 has been formed, a thick-film sealing layer 37 is formed above the entire surface of the support body 13, see FIG. 10A and FIG. 10B. The sealing layer 37 may, for example, be configured by an epoxy resin. The sealing layer 37 may, for example, be formed by spin coating. The sealing layer 37 is cured by heat treatment. In the following description the reference numeral "37" is appended to the cured sealing layer. The thick-film sealing layer 37 has a thickness such that the outer end electrode 25 and the inner end electrode 27 are buried therein.

Figure 11A:
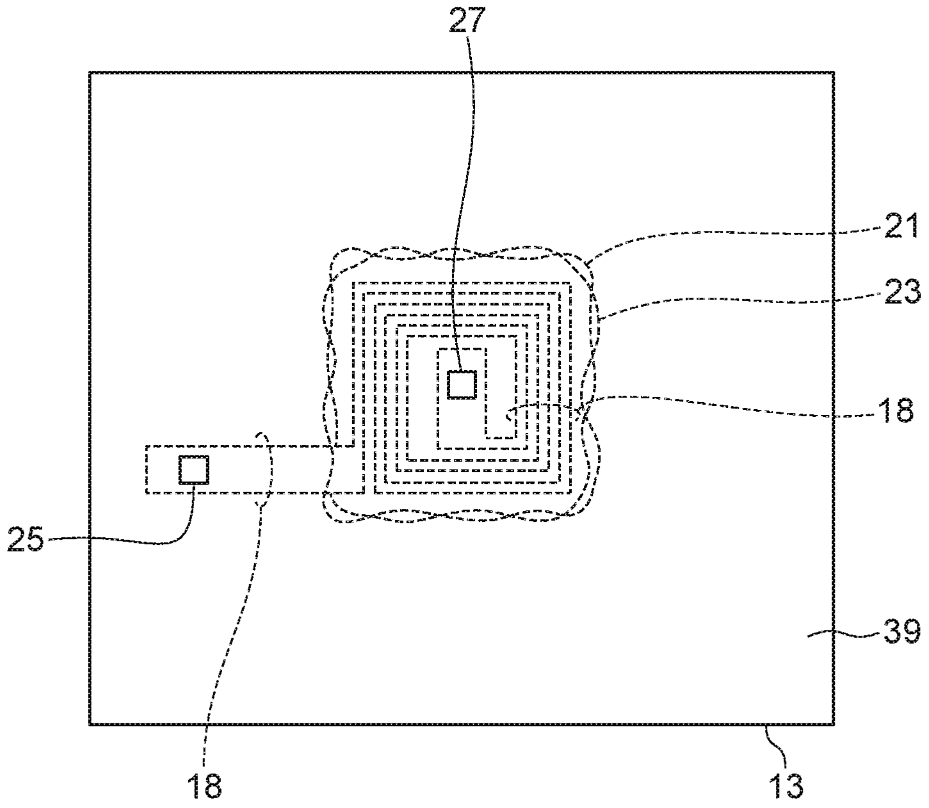
FIG. 11A is a plan view illustrating a single element block in a fabrication process of an element according to FIG. 1A.
Figure 11B:
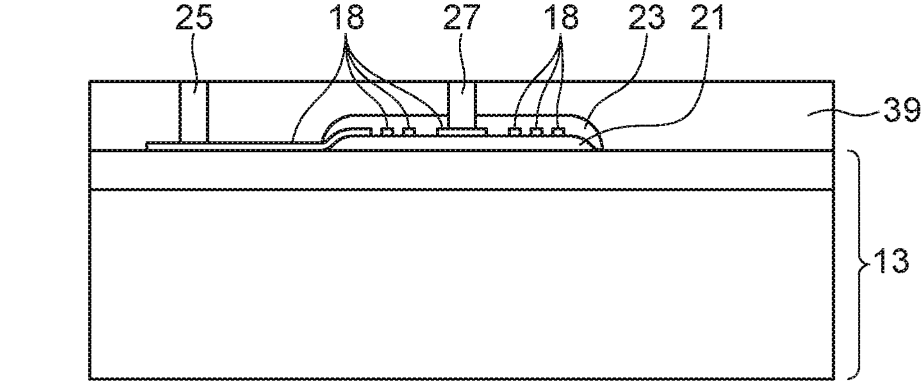
FIG. 11B is a diagram illustrating a fabrication process in a cross-section corresponding to line Ib-Ib of FIG. 1A.

The thick-film sealing layer 37 is then polished, and upper ends of the outer end electrode 25 and the inner end electrode 27 are exposed, see FIG. 11A and FIG. 11B. The thick-film sealing layer 37 becomes a sealing body 39 when polished. The sealing body 39 may, for example, have a thickness of the order of 300 microns or less. The first soft magnetic body layer 21 may, for example, have a thickness of the order of 100 microns or less. The second soft magnetic body layer 23 may, for example, have a thickness of the order of 100 microns or less. Moreover, the first soft magnetic body layer 21 may, for example, have a thickness of the order of 40 microns or greater. The second soft magnetic body layer 23 may, for example, have a thickness of the order of 40 microns or greater. The second soft magnetic body layer 23 enables the inductor to be separated from the sealing body 39.

Figure 12A:
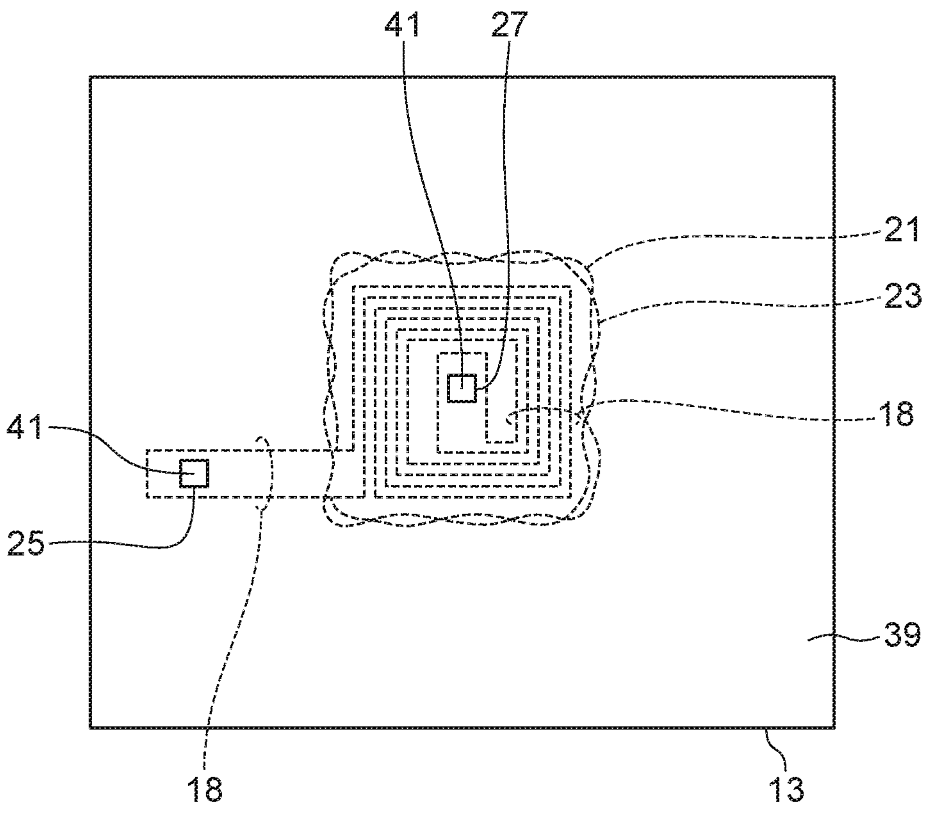
FIG. 12A is a plan view illustrating a single element block in a fabrication process of an element according to FIG. 1A.
Figure 12B:
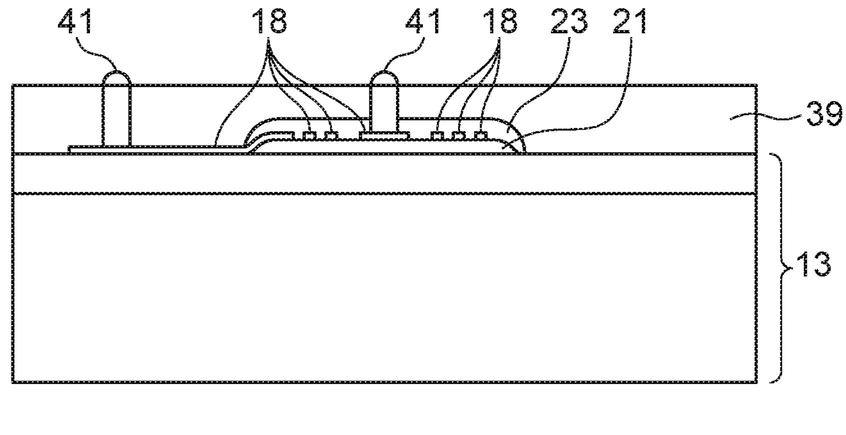
FIG. 12B is a diagram illustrating a fabrication process in a cross-section corresponding to line Ib-Ib of FIG. 1A.

After the sealing body 39 has been formed, electrodes 41 are formed on upper ends where the outer end electrode 25 and the inner end electrode 27 are exposed, see FIG. 12A and FIG. 12B. The electrodes 41 may, for example, contain solder balls.

Figure 13A:
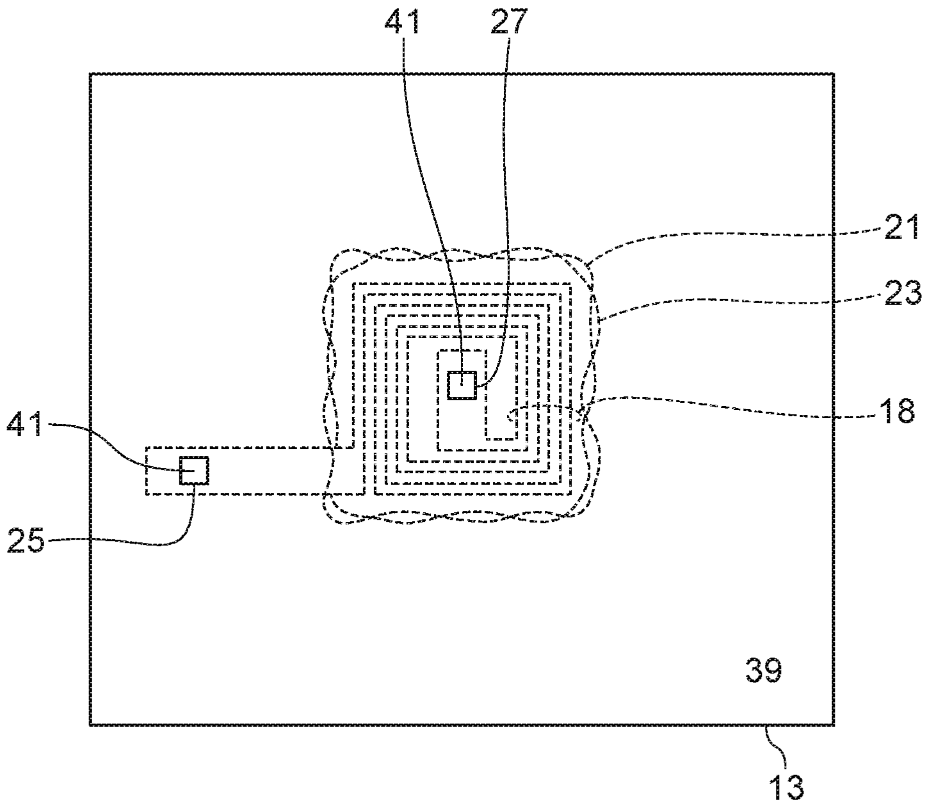
FIG. 13A is a plan view illustrating a single element block in a fabrication process of an element according to FIG. 1A.
Figure 13B:
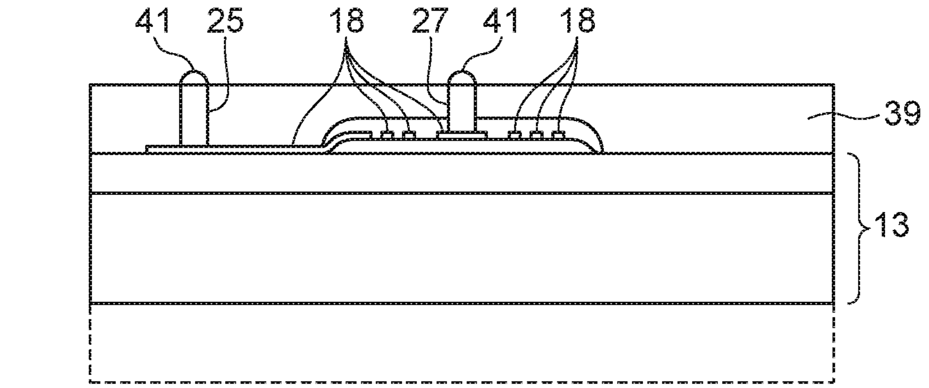
FIG. 13B is a diagram illustrating a fabrication process in a cross-section corresponding to line Ib-Ib of FIG. 1A.

After the sealing body 39 has been formed, the back face of the support body 13 (substrate) is polished so as to provide a desired thickness for the support body 13, see FIG. 13A and FIG. 13B. Side faces of the outer end electrode 25 and the inner end electrode 27 are covered by the sealing body 39. The wafer employed in fabrication may, for example, have a thickness of the order of 700 microns. The support body 13 may, for example, have a thickness of the order of 200 microns or less.

According to such a fabrication method, the conducting layer 18 of the inductor 17 is formed after the first soft magnetic body layer 21 has been formed to the first area 13*b*, and also the second soft magnetic body layer 23 is formed to the first area 13*b* after the conducting layer 18 of the inductor 17 has been formed. At least the inductor main portion 18*a* of the conducting layer 18 is provide between the first soft magnetic body layer 21 and the second soft magnetic body layer 23. The outer end electrode 25 is separated from the first soft magnetic body layer 21 and the second soft magnetic body layer 23. The region where the first soft magnetic body layer 21 and the second soft magnetic body layer 23 are formed is smaller than the entire surface of the main face 13*a*, and so warping of the support body 13 (substrate, wafer) is reduced.

The outer end electrode 25 is formed without processing the first soft magnetic body layer 21 or the second soft magnetic body layer 23. In this fabrication method the inner end electrode 27 is also formed without processing the first soft magnetic body layer 21 or the second soft magnetic body layer 23.

As described above, the present exemplary embodiment provides an inductance element having a structure that may reduce warping, and a method to fabricate an inductance element that may enable a reduction in warping.

The present disclosure is not limited to the exemplary embodiment described above, and various modifications may be implemented within a range not departing from the spirit of the present disclosure. All of these are included in the technical concept of the present disclosure.

What is claimed is:

1. An inductance element comprising:

a support body including a main face including a first area and a second area surrounding the first area;

a first resin body disposed within the first area; and an inductor provided at the main face of the support body, wherein the first resin body includes a first soft magnetic body layer and a second soft magnetic body layer that are both disposed inside the first area, wherein the inductor is positioned between the first soft magnetic body layer and the second soft magnetic body layer, wherein the first soft magnetic body layer includes a first insulating resin body and a plurality of first magnetic bodies surrounded by the first insulating resin body, and wherein the second soft magnetic body layer includes a second insulating resin body and a plurality of second magnetic bodies surrounded by the second insulating resin body.

2. The inductance element of claim 1, wherein:

the inductor includes a conducting layer having a pattern configured to generate inductance and extending along the main face;

the conducting layer includes a first portion positioned inside the first area and a second portion positioned inside the second area; and the inductance element further comprises an outer end electrode positioned above the second portion.

3. The inductance element of claim 2, wherein the pattern has a spiral shape including an inner end positioned above the first area and including an outer end positioned above the second area.

4. The inductance element of claim 2, wherein:

the inductance element further comprises an inner end electrode positioned above the first portion;

the first portion of the conducting layer is positioned above the first soft magnetic body layer;

the conducting layer further includes a third portion positioned between the first area and the second area of the main face; and the third portion of the conducting layer crosses a boundary between the first area and the second area and links the first portion and the second portion together.

5. The inductance element of claim 4, wherein:

the second soft magnetic body layer includes a hole positioned above the first portion and reaching as far as the first portion of the conducting layer;

the inner end electrode is positioned in the hole of the second soft magnetic body layer such that the second soft magnetic body layer covers part of a side face of the inner end electrode.

6. The inductance element of claim 4, further comprising a second resin body provided above the first area and the second area and covering a side face of the outer end electrode, wherein the inner end electrode includes a lower portion inside and covered by the first resin body and an upper portion positioned outside the first resin body, and wherein the second resin body covers an upper portion of the outer end electrode.

7. A method for fabricating an inductance element, the method comprising:

preparing a substrate including a main face with a first area and a second area surrounding the first area;

forming a first soft magnetic body layer above the first area of the substrate;

forming, after the first soft magnetic body layer has been formed, a conducting layer that includes a first portion positioned above the first area and a second portion positioned above the second area and that spans to the first area of the substrate and the second area of the substrate;

forming an outer end electrode above the second portion of the conducting layer; and forming, after the conducting layer has been formed, a second soft magnetic body layer in the first area of the substrate, wherein the first soft magnetic body layer includes a first insulating resin body and a plurality of first magnetic bodies surrounded by the first insulating resin body, and wherein the second soft magnetic body layer includes a second insulating resin body and a plurality of second magnetic bodies surrounded by the second insulating resin body.

8. The method for fabricating the inductance element of claim 7, further comprising:

forming an inner end electrode above the first portion of the conducting layer after the conducting layer has been formed and in advance of forming the second soft magnetic body layer in the second area of the substrate, wherein the second soft magnetic body layer partially covers a side face of the inner end electrode.

* * * * *